(12) United States Patent
Ham et al.

(10) Patent No.: US 10,134,630 B2
(45) Date of Patent: Nov. 20, 2018

(54) METAL-GRAPHENE HETEROJUNCTION METAL INTERCONNECTS, METHOD OF FORMING THE SAME, AND SEMICONDUCTOR DEVICE INCLUDING THE SAME

(71) Applicant: GWANGJU INSTITUTE OF SCIENCE AND TECHNOLOGY, Gwangju (KR)

(72) Inventors: Moon-Ho Ham, Gwangju (KR); Myungwoo Son, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/617,119

(22) Filed: Jun. 8, 2017

(65) Prior Publication Data

US 2017/0358486 A1    Dec. 14, 2017

(30) Foreign Application Priority Data

Jun. 10, 2016    (KR) .................. 10-2016-0072067

(51) Int. Cl.
*H01L 23/48*    (2006.01)
*H01L 21/768*    (2006.01)
*H01L 23/532*    (2006.01)
*H01L 23/522*    (2006.01)

(52) U.S. Cl.
CPC .. *H01L 21/76864* (2013.01); *H01L 21/76843* (2013.01); *H01L 21/76879* (2013.01); *H01L 23/53209* (2013.01); *H01L 23/53276* (2013.01); *H01L 23/5226* (2013.01)

(58) Field of Classification Search
CPC ......... H01L 21/76864; H01L 21/76843; H01L 21/76879; H01L 23/5226; H01L 23/53209; H01L 23/53276
See application file for complete search history.

(56) References Cited

U.S. PATENT DOCUMENTS

2012/0080662 A1*   4/2012   Saito ................. H01L 21/28556
                                                              257/29
2018/0033864 A1*   2/2018   Cao ................... H01L 29/66568

* cited by examiner

*Primary Examiner* — Victor A Mandala
*Assistant Examiner* — Colleen E Snow
(74) *Attorney, Agent, or Firm* — Hauptman Ham, LLP

(57) ABSTRACT

Disclosed herein are a metal-graphene heterojunction metal interconnect, a method of forming the same, and a semiconductor device including the same. The method includes: a) forming a carbon source layer by depositing a carbon source on a top surface of a substrate; b) forming a metal catalyst layer by depositing a metal catalyst on the carbon source layer; and c) carrying out heat treatment on the substrate comprising the carbon source layer and the metal catalyst layer. The graphene can be formed by carrying out the heat treatment only once irrespectively of the number of substrates, and accordingly to the manufacturing time and manufacturing cost of the metal interconnect are reduced, and a damage to the metal interconnect by the heat treatment is not caused.

13 Claims, 3 Drawing Sheets

METAL-GRAPHENE HETEROJUNCTION METAL INTERCONNECTS, METHOD OF FORMING THE SAME, AND SEMICONDUCTOR DEVICE INCLUDING THE SAME

CROSS-REFERENCE TO RELATED APPLICATIONS

This application claims the priority of Korean Patent Application No. 2016-0072067, filed on Jun. 10, 2016, in the Korean Intellectual Property Office, the disclosure of which is hereby incorporated by reference in its entirety.

BACKGROUND

1. Technical Field

The present disclosure relates to a metal-graphene heterojunction metal interconnects, a method of forming a metal-graphene heterojunction metal interconnects in a semiconductor device, and a semiconductor device including a metal-graphene heterojunction metal interconnects.

2. Description of the Related Art

As the size of the semiconductor devices decrease, the width and spacing of the metal interconnects gradually decrease. When metal interconnects in a semiconductor device are made of copper, the resistance rapidly increases as the width decreases, and thus it is difficult to use it for a semiconductor device in size from several to several tens of nanometers.

Recently, a method of applying a carbon material for interconnects as a low-resistance material has been studied around the world. Among carbon materials, a method of applying graphene to interconnects is being broadly studied.

The graphene is a two-dimensional conductive material made of carbon atoms. The graphene has a honeycomb structure such that it is chemically stable and it can be easily processed into one-dimensional or two-dimensional nano-sized pattern. In addition, the graphene has high thermal conductivity and has excellent electrical conductivity that can transfer electrons as if they have no mass. Accordingly, it is attracting attention as a next-generation electronic material that can replace silicon which is currently used as the major material for semiconductor devices.

In addition, the graphene has ballistic transport characteristic due to quantum conduction and thus is expected to be used as low-resistance interconnects for a very large scale integrated circuit (VLSI) to replace metal interconnects.

In order to use graphene as metal interconnects of a semiconductor device, high-quality graphene is required. To this end, in the related art, a metal-graphene heterojunction metal interconnect has been fabricated by transferring a large-area graphene synthesized by chemical vapor deposition (CVD) to a metal interconnect and patterning it via an etching process. In the related art, however, there are problems in that the graphene synthesis and transfer process incur high manufacturing cost and take a long processing time, and that graphene is damaged (torn or wrinkled) or transfer medium residues are generated in the transferring process, which adversely affects the performance of the electronic devices. Further, graphene may be physically damaged or become defective in the process of etching it, such that the electrical characteristics of the graphene may be deteriorated. Also, since graphene has a two-dimensional plate-like structure, it is difficult to apply it to vertical interconnect structure.

Under the circumstances, what is required is a technique to fabricate a metal-graphene heterojunction metal interconnect by coating graphene on the entire surface of a vertical or horizontal metal interconnect via a single graphene synthesis process.

SUMMARY

It is an object of the present disclosure to provide a method of forming a metal-graphene heterojunction metal interconnect on a semiconductor device.

It is another object of the present disclosure to provide a metal-graphene heterojunction metal interconnect.

It is yet another object of the present disclosure to provide a semiconductor device including the metal-graphene heterojunction metal interconnect fabricated according to the above method.

In accordance with one aspect of the present disclosure, a method of forming a metal-graphene heterojunction metal interconnect comprises: a) forming a carbon source layer by depositing a carbon source on a top surface of a substrate; b) forming a metal catalyst layer by depositing a metal catalyst on the carbon source layer; and c) synthesizing a graphene with a portion of the carbon source layer in contact with the metal catalyst layer by carrying out heat treatment on the substrate comprising the carbon source layer and the metal catalyst layer.

The method may further include: after step c), removing a portion of the graphene layer and the metal catalyst layer formed on the top surface of the substrate where no metal interconnect is to be formed.

The method may further include: between steps b) and c), b') depositing a carbon source on an exposed surface of the metal catalyst layer. The method may further include: before step b'), removing the portion of the graphene layer and the metal catalyst layer formed on the top surface of the substrate where no metal interconnect is to be formed; and after step c), removing a portion of the carbon source layer that was not involved in synthesizing the graphene.

The method may include: repeating steps a) and b) alternately, wherein another substrate is stacked on the substrate after step b). The method may include, after step b), repeating steps of removing a portion of the graphene layer and the metal catalyst layer formed on the top surface of the substrate where no metal interconnect is to be formed, and stacking another substrate on the substrate. The method may further include: between steps b) and c), b') depositing a carbon source on an exposed surface of the metal catalyst layer.

The substrate may have a trench formed therein, the carbon source layer may be formed in the trench, and the metal catalyst layer may be deposited on the carbon source layer formed in the trench such that the trench is filled with the metal catalyst.

The carbon source may include at least one selected from the group consisting of natural graphite, synthetic graphite, highly ordered pyrolytic graphite (HOPG), activated graphite, carbon monoxide, carbon dioxide, methane, ethane, ethylene, methanol, ethanol, acetylene, propane, propylene, butane, butadiene, pentane, pentene, cyclopentadiene, hexane, cyclohexane, benzene, pyridine, toluene, polymethyl methacrylate (PMMA), polystyrene, polyacrylonitrile (PAN), PEDOT:PSS, molecules having a polyaromatic hydrocarbon (PAH) structure, methylnaphthalene, hexabromobenzene, naphthalene, terphenyl, pentachloropyridine, tetrabromothiophene, benzopyrene, azulene, trimethylnaphthalene, acenaphthene, acenaphthylene, anthracene, fluorene, phenalene, phenanthrene, benz(a)anthracene, benzo(a) fluorene, benzo(c)phenanthrene, chrysene, fluoranthene, pyrene, tetracene, triphenylene, benz(e)acephenanthrylene, benzofluoranthene, dibenzanthracene, olympicene, pentacene, perylene, picene, tetraphenylene, zethrene, ovalene, kekulene, hexacene, heptacene, diindenoperylene, dicoronylene, coronene, corannulene, benzo(ghi)perylene, anthanthrene, hexamethyl-dihydro-4H-benzoquinolizinoacridine, 4H-benzoquinolizinoacridinetrione, and hexaazatriphenylene-hexacarbonitrile.

The metal catalyst layer may include at least one selected from the group consisting of copper (Cu), nickel (Ni), iron (Fe), platinum (Pt), aluminum (Al), cobalt (Co), ruthenium (Ru), palladium (Pd), chromium (Cr), manganese (Mn), gold (Au), silver (Ag), molybdenum (Mo), rhodium (Rh), tantalum (Ta), titanium (Ti), tungsten (W), uranium (U), vanadium (V), zirconium (Zr), iridium (Ir), brass, bronze and stainless steel.

The heat treatment may be carried out at a temperature from 25 to 400° C.

The heat source for the heat treatment may use at least one selected from the group consisting of a microwave source, an ultraviolet source, a plasma source, a laser source and a heater.

The layers formed on the top surface of the substrate may be removed by at least one selected from the group consisting of polishing, evaporation, wet etching and dry etching.

In accordance with another aspect of the present disclosure, a metal-graphene heterojunction metal interconnect comprises: a metal catalyst layer; and a graphene disposed in contact with all or all but one surfaces of the metal catalyst layer.

In accordance with yet another aspect of the present disclosure, a semiconductor device comprises: a substrate having a trench therein; a metal catalyst layer, with which the trench in the substrate is filled; and a graphene disposed in contact with all or all but one surfaces of the metal catalyst layer. The surface of the metal catalyst layer that is not in contact with the graphene is exposed out of the trench.

The semiconductor device may include a number of substrates stacked on one another, in each of which the metal-graphene heterojunction metal interconnect is formed.

According to an exemplary embodiment of the present disclosure, a vertical metal-graphene heterojunction metal interconnect as well as a horizontal metal-graphene heterojunction metal interconnect can be fabricated, by carrying out heat treatment only to once irrespectively of the number of semiconductor layers. As a result, the manufacturing time and manufacturing cost of the metal interconnect are reduced, and the metal interconnect is not damaged by the heat treatment.

Further, since the graphene having excellent electrical conductivity is deposited on all the surfaces of the metal interconnect, the electrical characteristics are improved.

In addition, according to an exemplary embodiment of the present disclosure, unlike an existing metal interconnect using TiN or the like for an additional diffusion barrier for a metal catalyst, graphene itself can be used as a diffusion barrier as well as an oxidation barrier without any additional material, such that the stability of the interconnect can be improved.

DETAILED DESCRIPTION

Figure 1:
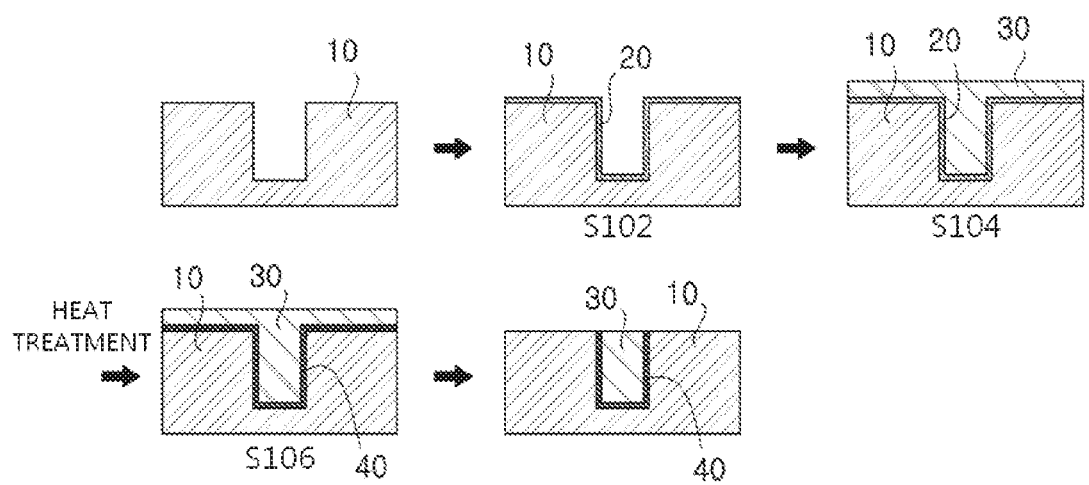
FIG. 1 is a diagram schematically showing a method of forming a metal-graphene heterojunction metal interconnect on a substrate according to an exemplary embodiment of the present disclosure.

Exemplary embodiments of the present disclosure relate to a metal-graphene heterojunction metal interconnect in which graphene is disposed on all or all but one surfaces of a metal catalyst layer, a method of forming the metal-graphene heterojunction metal interconnect, and a semiconductor device including the same.

Previously, a heterojunction metal interconnect has been fabricated by (i) a method of synthesizing graphene by chemical vapor deposition and then transferring it onto a semiconductor metal catalyst interconnect, or by (ii) a method of directly synthesizing graphene on a metal catalyst interconnect.

However, in the method (i), the quality of the graphene is lowered in the transferring step, and both the synthesis and the transferring has to be carried out so as to increase the processing cost. In addition, it cannot be applied to a vertical interconnect structure. Further, in the method (ii), the graphene synthesis process has to be repeated to fabricate a multi-layered semiconductor device so as to increase the process cost, and the semiconductor device is damaged due to repeated heat treatment.

In contrast, according to an exemplary embodiment of the present disclosure, a vertical metal-graphene heterojunction metal interconnect can be manufactured as well as a horizontal metal-graphene heterojunction metal interconnect, and the graphene can be formed by carrying out heat treatment only once irrespectively of the number of layers. As a result, the manufacturing time and manufacturing cost of the metal interconnects can be reduced, without damaging the metal interconnects by the heat treatment.

Also, according to an exemplary embodiment of the present disclosure, a metal-graphene heterojunction metal interconnect in which graphene is disposed on all but one surfaces of the metal catalyst may be used as a diffusion barrier. A metal-graphene heterojunction metal interconnect in which graphene is disposed on all surfaces may be used as an oxidation barrier as well as a diffusion barrier.

Hereinafter, exemplary embodiments of the present disclosure will be described in detail.

According to an exemplary embodiment of the present disclosure, a method of forming a metal-graphene heterojunction metal interconnect comprises: a) forming a carbon source layer by depositing a carbon source on a top surface of a substrate; b) forming a metal catalyst layer by depositing a metal catalyst on the carbon source layer; and c) synthesizing a graphene with a portion of the carbon source layer in contact with the metal catalyst layer by carrying out heat treatment on the substrate comprising the carbon source layer and the metal catalyst layer.

First, in step a), the carbon source is deposited on the top surface of the substrate, which is an insulating material, to form the carbon source layer.

The substrate is not particularly limited as long as it is an insulating material and the carbon source can be easily deposited thereon. As many substrates as desired can be deposited.

Further, the substrate may or may not have a patterned trench therein. Preferably, the substrate has a trench formed therein. The cross-sectional shape of the trench may be, but is not limited to, U, V, ⊔, etc. In addition, the trench may be a horizontal trench having its width larger than its depth or a vertical trench having its depth larger than its width.

Further, the substrate can be applied to a semiconductor interconnect process. Specifically, the substrate may include: an oxide substrate such as a $SiO_2$ substrate, an ITO substrate, a $SnO_2$ substrate, a $TiO_2$ substrate and an $Al_2O_3$ substrate; a metal substrate selected from the group consisting of Cu, Ni, Fe, Pt, Al, Co, Ru, Pd, Cr, Mn, Au, Ag, Mo, Rh, Ta, Ti, W, U, V, Zr, Ir and combinations thereof; a flexible substrate such as polyethylene terephthalate (PET), polyethylene sulfone (PES), polymethyl methacrylate (PMMA), polyimide, polyethylene naphthalate (PEN), polycarbonate (PC); and a glass substrate.

The carbon source may be deposited on the top surface of the substrate and may be deposited not only in the trench but also on the surface of the substrate other than the trench. The portion of the carbon source deposited on the surface other than the trench may be removed as desired.

Also, the carbon source is disposed on all or all but on surfaces of the metal catalyst layer and is used to synthesize graphene via heat treatment performed at a temperature of 25 to 400° C. only once. The carbon source may include at least one selected from the group consisting of natural graphite, synthetic graphite, highly ordered pyrolytic graphite (HOPG), activated graphite, carbon monoxide, carbon dioxide, methane, ethane, ethylene, methanol, ethanol, acetylene, propane, propylene, butane, butadiene, pentane, pentene, cyclopentadiene, hexane, cyclohexane, benzene, pyridine, toluene, polymethyl methacrylate (PMMA), polystyrene, polyacrylonitrile (PAN), PEDOT:PSS, to molecules having a polyaromatic hydrocarbon structure, methylnaphthalene, hexabromobenzene, naphthalene, terphenyl, pentachloropyridine, tetrabromothiophene, benzopyrene, azulene, trimethylnaphthalene, acenaphthene, acenaphthylene, anthracene, fluorene, phenalene, phenanthrene, benz(a)anthracene, benzo(a)fluorene, benzo(c)phenanthrene, chrysene, fluoranthene, pyrene, tetracene, triphenylene, benz(e)acephenanthrylene, benzofluoranthene, dibenzanthracene, olympicene, pentacene, perylene, picene, tetraphenylene, zethrene, ovalene, kekulene, hexacene, heptacene, diindenoperylene, dicoronylene, coronene, corannulene, benzo(ghi)perylene, anthanthrene, hexamethyl-dihydro-4H-benzoquinolizinoacridine, 4H-benzoquinolizinoacridinetrione, and hexaazatriphenylene-hexacarbonitrile. If a material used as the carbon source synthesizes graphene at a temperature exceeding 400° C., the metal interconnect and the semiconductor device may be damaged, such that the electrical characteristics and interconnect stability may be deteriorated.

One surface of the metal catalyst layer where the carbon source is not disposed refers to the exposed surface out of the trench.

The method of depositing the carbon source is not particularly limited as long as the carbon source can be deposited on the top surface of the substrate. Preferably, the carbon source may be deposited by chemical vapor deposition (CVD), physical vapor deposition (PVD), atomic layer deposition (ALD) or solution process. The method of depositing the carbon source allows for a large and uniform carbon source thin film, and allows the thickness of the carbon source thin film to be precisely controlled at nanometer-level, thereby precisely controlling the number of layers of graphene synthesized by heat treatment.

For example, the chemical vapor deposition (CVD) may include, but is not limited to, thermal chemical vapor deposition (TCVD), rapid thermal chemical vapor deposition (RTCVD), an inductively coupled plasma chemical vapor deposition (ICP-CVD), low pressure chemical vapor deposition (LPCVD), atmospheric pressure chemical vapor deposition (APCVD), metal organic chemical vapor deposition (MOCVD), and a plasma-enhanced chemical vapor deposition (PECVD).

The physical vapor deposition (PVD) may include, but is not limited to, sputtering, electron beam evaporation, thermal evaporation, molecular beam epitaxy (MBE), laser molecular beam epitaxy (L-MBE), and pulsed laser deposition (PLD).

The solution process may include, but is not limited to, spin coating, spray coating, a doctor blade method, dip coating, bar coating, and inkjet printing.

Subsequently, in step b), a metal catalyst is deposited on the carbon source layer to form a metal catalyst layer.

Specifically, the trench on which the carbon source layer is disposed is filled with the metal catalyst until it reaches the height of the trench, to form the metal catalyst layer. If the metal catalyst is below the height of the trench, the electrical characteristics are lowered. In addition, when another substrate is stacked on the substrate, a space is created between the two substrates, and thus the stability of the metal interconnect may be lowered.

The metal catalyst layer thus formed has three surfaces with the carbon source inside the trench but has one surface exposed to the outside. This will be described in detail with reference to FIG. 1.

If a part of the metal catalyst layer is exposed to the outside, step b') of depositing a carbon source layer on the exposed surface of the metal catalyst layer to dispose the carbon source layer on all surfaces of the metal catalyst layer may be further carried out. This will be described in detail with reference to FIG. 2.

The metal catalyst works as a catalyst for graphene synthesis, and a metal capable of adsorbing carbon efficiently can be used. The metal catalyst layer is made of only metal, which may be at least one selected from the group consisting of copper (Cu), nickel (Ni), iron (Fe), platinum (Pt), aluminum (Al), cobalt (Co), ruthenium (Ru), palladium (Pd), chromium (Cr), manganese (Mn), gold (Au), silver (Ag), molybdenum (Mo), rhodium (Rh), tantalum (Ta), titanium (Ti), tungsten (W), uranium (U), vanadium (V), zirconium (Zr), iridium (Ir), brass, bronze and stainless steel.

The metal catalyst layer may be formed by, but is not limited to, atomic layer deposition (ALD), sputtering, thermal evaporation, electron beam evaporation, molecular beam epitaxy (MBE), laser molecular beam epitaxy (L-MBE), pulsed laser deposition (PLD), chemical vapor deposition (CVD), a sol-gel process, or electro-plating.

The metal catalyst layer is injected into the trench patterned in the substrate so that the metal catalyst itself can be used as an interconnect.

According to an exemplary embodiment of the present disclosure, by repeating steps a) and b) alternately, wherein another substrate is stacked on the substrate after step b), the heterojunction metal interconnects are vertically connected to realize a vertical metal interconnect. This will be described in detail with reference to FIG. 3.

Subsequently, in the step c), the substrate including the carbon source layer and the metal catalyst layer is heat-treated to synthesize graphene from the carbon source.

The heat treatment is carried out at a low temperature, preferably 25 to 400° C. By using a carbon source that can synthesize graphene within the above temperature range, a graphene layer is synthesized with the carbon source layer by a low temperature heat treatment. When graphene is synthesized at a high temperature above 400° C., the metal interconnect and semiconductor elements may be damaged. Accordingly, the graphene synthesis is carried out at a low temperature The heat source for the heat treatment uses at least one selected from the group consisting of a microwave source, an ultraviolet light source, a plasma source, a laser source and a heater.

The microwave is an electromagnetic wave having a frequency of about 300 to 30,000 MHz. When the microwave is irradiated onto the metal catalyst layer-carbon source layer directly or indirectly, the carbon source layer included in the metal catalyst layer-carbon source layer absorbs the microwave, such that the carbon source layer may be heated. For example, the microwave may be irradiated for one to ten minutes.

The ultraviolet light collectively refers to a wide range of electromagnetic waves having a wavelength ranging from about 200 to 400 nm. Like the microwave, the carbon source layer can be heat-treated as the carbon source layer absorbs ultraviolet light.

Plasma refers to a state of a matter in which a gas is fully ionized. Specifically, sufficient energy is applied to the gas, and as the temperature further increases, the gas decomposes into atoms, which are basic elements of the material. As the temperature becomes higher, atoms lose electrons and become positive ions, resulting in a material state in which the surrounding materials are made of positive ions and free electrons. The plasma has free electrons that allow current to flow, and thus an apparatus using the plasma can be used as a heat source for heat-treating the carbon source layer.

The heater is an apparatus that can convert electricity into heat energy. The heater can directly heat a material in contact with the heater, so that the carbon source layer can be heat-treated.

As described above, by using at least one selected from a microwave source, an ultraviolet light source, a plasma source, a laser source and a heater as the heat source, the metal catalyst layer-carbon source layer is heat-treated at a temperature of 400° C. or lower. As a result, the metal catalyst layer is activated and the decomposition reaction of the supplied carbon source can be facilitated in this manner, the carbon source layer deposited on the metal catalyst layer can synthesize the graphene layer.

Between steps a) to c), a portion of the carbon source layer and/or the metal catalyst layer formed on the top surface of the substrate other than the trench may be removed as desired. It is preferable to remove the portion of the carbon source layer and/or the metal catalyst layer formed on the top surface of the substrate other than the trench to achieve stability and good quality of the produced semiconductor devices.

Specifically, after step c), the portion of the graphene layer and the metal catalyst layer formed on the top surface of the substrate other than the trench may be removed. If step b') is added, the portion of the graphene layer and the metal catalyst layer formed on the top surface of the substrate other than the trench may be removed before step b'), and the carbon source layer formed on the top surface of the substrate may be removed after step c). If steps a) and b) are repeated alternately, the portion of the graphene layer and the metal catalyst layer formed on the top surface of the substrate other than the trench may be removed after step b).

The layers formed on the top surface of the substrate may be removed by at least one selected from the group consisting of polishing, evaporation, wet etching and dry etching, preferably polishing.

The polishing selectively removes the carbon source layer and/or the metal catalyst layer by fixing an abrasive to a buff made of a soft cloth and rotating it at a high speed.

The evaporation is performed by selectively evaporating the carbon source layer and/or the metal catalyst layer through a heart treatment process under vacuum.

The wet etching is performed using an at least one etchant selected from the group consisting of acid, hydrogen fluoride (HF), ferric chloride ($FeCl_3$), iron nitrate ($Fe(NO_3)_3$), copper chloride ($CuCl_2$), ammonium persulfate (($NH_4)_2S_2O_8$), sodium persulfate ($Na_2S_2O_8$) and a buffered oxide etchant (BOE), to selectively remove the carbon source layer and/or the metal catalyst layer.

The dry etching selectively removes the carbon source layer and/or the metal catalyst layer using reaction of a gas plasma or an activated gas. The dry etching may be performed using at least one selected from the group consisting of sputter etching, reactive ion etching (RIE) and vapor phase etching.

After the carbon source layer and/or the metal catalyst layer are removed, a process of cleaning the residual material with DI water may be additionally performed. The process of cleaning may be performed using, but is not limited to, an organic solution such as isopropyl alcohol, nitric acid etching solution, hydrogen peroxide etching solution, chromate etching solution, ozone etching solution and ferrite etching solution, or deionized water.

An exemplary embodiment of the present disclosure also provides a semiconductor device including a metal-graphene heterojunction metal interconnect.

The semiconductor device according to an exemplary embodiment of the present disclosure includes a substrate in which a trench is formed, a metal catalyst layer in the trench in a substrate, and a graphene disposed on all or all but one surfaces of the metal catalyst layer. For example, when the graphene is provided between the inner surfaces of the trench and the metal catalyst layer, i.e., graphene is provided only on the three surfaces, it works as a diffusion barrier that prevents diffusion of the metal catalyst to the substrate.

When the graphene is provided on all the surfaces of the metal catalyst, it also works as an oxidation barrier that prevents the oxidation of the metal catalyst as well as the diffusion barrier.

In addition, a number of the substrates on which the metal-graphene heterojunction metal interconnects are formed, preferably 1 to 50 substrates, may be stacked on one another, and thus the metal interconnects can be connected to each other to obtain vertical metal interconnects.

A method of forming metal-graphene heterojunction metal interconnects according to an exemplary embodiment of the present disclosure will be described in detail with reference to the drawings, for illustrative purpose only.

FIG. 1 is a diagram schematically showing a method of forming a metal-graphene heterojunction metal interconnect on a substrate according to an exemplary embodiment of the present disclosure.

As shown in FIG. 1, a carbon source 20 is deposited on a top surface of a substrate 10 in which a trench is formed to form a carbon source layer (step S102), the carbon source layer deposited in the trench is tilled with a metal catalyst layer 30 (step S104), and then heat treatment is carried out to synthesize a graphene 40 from the carbon source layer in contact with the metal catalyst layer (step S106). After the heat treatment, the graphene layer and the metal catalyst layer formed outside the trench are removed, such that a semiconductor device having a metal-graphene heterojunction metal interconnect that can work as a diffusion barrier can be formed.

As shown in FIG. 1, when the graphene is formed only between the substrate and the metal catalyst layer, it can serve as a diffusion barrier. However, it cannot serve as an oxidation barrier since a surface of the metal catalyst layer is exposed.

Figure 2:
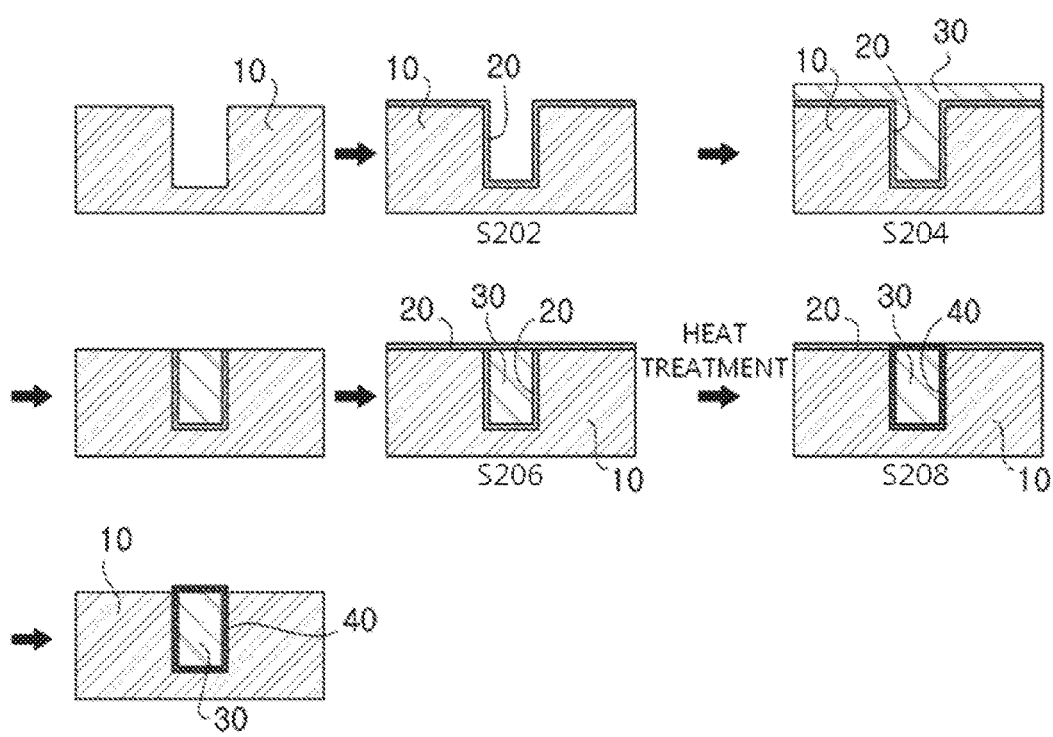
FIG. 2 is a diagram schematically showing a method of forming a metal-graphene heterojunction metal interconnect on a substrate according to another exemplary embodiment of the present disclosure.

FIG. 2 is a diagram schematically showing a method of forming a metal-graphene heterojunction metal interconnect on a substrate according to another exemplary embodiment of the present disclosure.

As shown in FIG. 2, a carbon source 20 is deposited on a top surface of a substrate 10 in which a trench is formed to form a carbon source layer (step S202), the carbon source layer deposited in the trench is filled with a metal catalyst layer 30 (step S204), a surface of the metal catalyst layer in the trench is exposed by removing the carbon source layer and the metal catalyst layer outside the trench and a carbon source is deposited on the exposed surface of the metal catalyst layer (step S206), and heat treatment is carried out to synthesize a graphene 40 from the carbon source layer in contact with the metal catalyst layer (step S208). After the heat treatment is carried out, the portion of the carbon source, which is not in contact with the metal catalyst layer and was not involved in synthesizing the graphene, is removed. In this manner, a semiconductor device having a metal-graphene heterojunction metal interconnect in which all surfaces of the metal catalyst layer are surrounded by the graphene can be formed.

As shown in FIG. 2, when the graphene is formed between the substrate and the metal catalyst layer and also on the exposed surface of the metal catalyst layer, the graphene can work as an oxidation barrier as well as a diffusion barrier.

Figure 3:
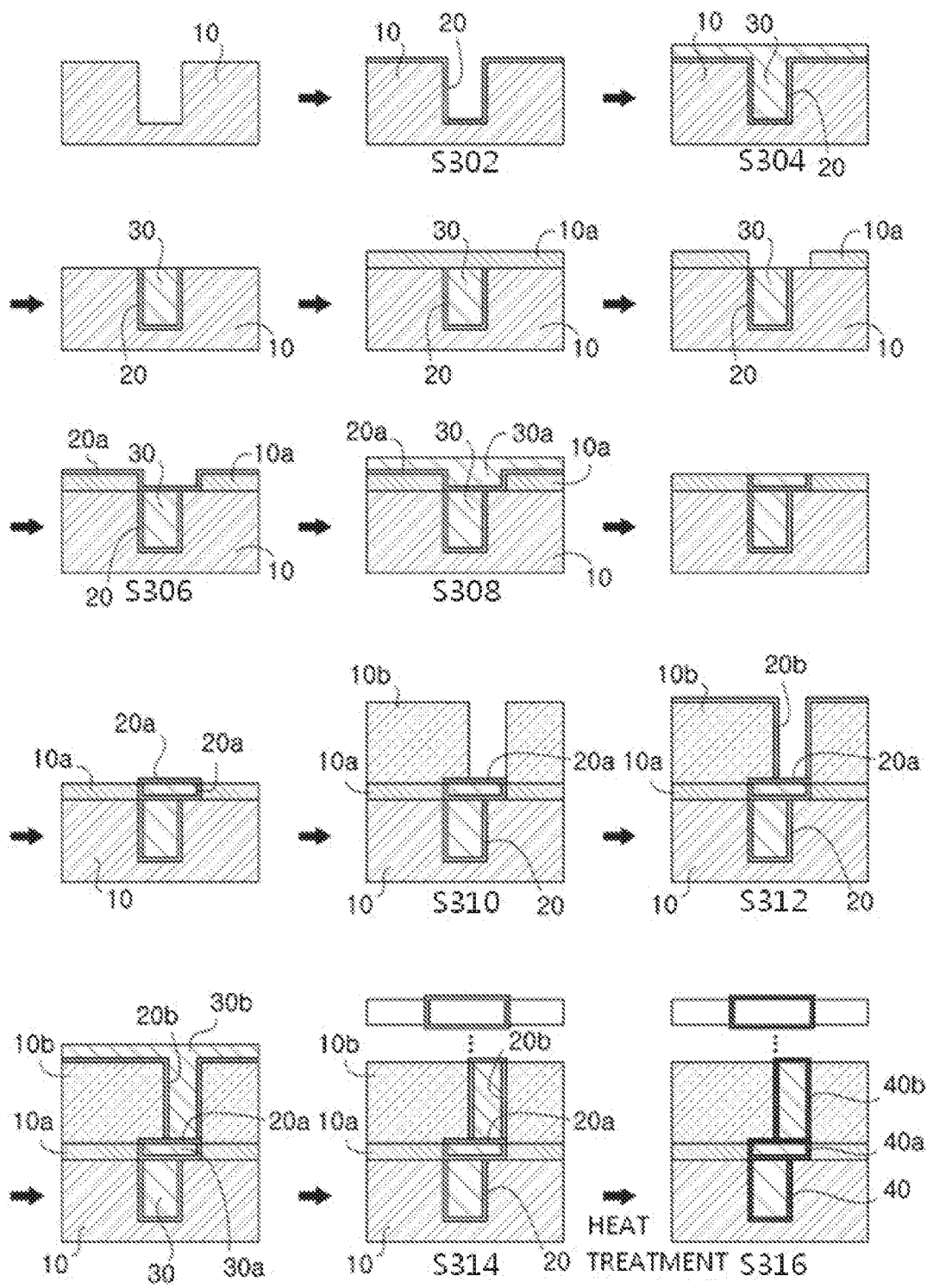
FIG. 3 is a diagram schematically showing a method of forming metal-graphene heterojunction metal interconnects on a plurality of substrates according to yet another exemplary embodiment of the present disclosure.

FIG. 3 is a diagram schematically showing a method of forming metal-graphene heterojunction metal interconnects on a plurality of substrates according to yet another exemplary embodiment of the present disclosure, in which steps S302 and S304 are repeated alternately.

As shown in FIG. 3, a carbon source 20 is deposited on a top surface of a substrate 10 in which a trench is formed to form a carbon source layer (step S302), the carbon source layer deposited in the trench is filled with a metal catalyst layer 30 (step S304), the carbon source layer and the metal catalyst layer outside the trench are removed, and a second substrate 10a is stacked on the substrate where the metal catalyst layer 20 and the carbon source layer 30 are formed and then the substrate was etched so that the metal catalyst layer 20 and the carbon source layer 30 are exposed. A second carbon source 20a is deposited on a top surface of the etched second substrate 10a to form a second carbon source layer (step S306), the second carbon source layer deposited in the trench is tilled with a second metal catalyst layer 30a (step S308), a surface of the second metal catalyst layer in the trench is exposed by removing the second carbon source layer and the second metal catalyst layer outside the trench and a second carbon source 20a is deposited on the exposed surface of the second metal catalyst layer, and the second carbon source layer formed outside the trench is removed. A third substrate 10b is stacked on the second substrate 10a where the second metal catalyst layer 20a and the second carbon source layer 30a are formed as described above, the substrate is etched so that a part of the second metal catalyst layer 20a and the second carbon source layer 30a is exposed, a third carbon source 20b is deposited on the etched third substrate 10b to form a third carbon source layer (step S310), the third carbon source layer deposited in the trench is filled with a third metal catalyst layer 30b (step S312), a surface of the third metal catalyst layer is exposed by removing the third carbon source layer and the third metal catalyst layer formed outside the trench and the third carbon source 20b is deposited on the exposed surface of the third metal catalyst layer (step S314), and heat treatment is carried out to synthesize graphene 40, 40a and 40b from the carbon source layers in contact with the metal catalyst layers (step S316).

As shown in FIG. 3, the number of vertically stacked substrates is not limited, and the metal-graphene heterojunction metal interconnects are formed by carrying out the heat treatment only once as the final processing step after the metal catalyst layers and the carbon source layers are formed in each of the substrates.

Although the present disclosure has been described with reference to exemplary embodiments thereof, those skilled in the art would understand that the exemplary embodiments are provided for illustrative and non-limitative purposes. Accordingly, changes, modifications, enhancements and/or refinements to the disclosed apparatuses and methods may be made without departing from the spirit or scope of the present disclosure. It will be appreciated that such changes, modifications, enhancements and/or refinements are encompassed within the scope of the present disclosure.

What is claimed is:

1. A method of forming a metal-graphene heterojunction metal interconnect, the method comprising:
    a) forming a carbon source layer by depositing a carbon source on a top surface of a substrate;
    b) forming a metal catalyst layer by depositing a metal catalyst on the carbon source layer;
    c) synthesizing a graphene with a portion of the carbon source layer in contact with the metal catalyst layer by carrying out heat treatment on the substrate comprising the carbon source layer and the metal catalyst layer;
    d) removing a portion of the graphene layer and the metal catalyst layer formed on the top surface of the substrate where no metal interconnect is to be formed.

2. The method of claim 1, wherein the substrate has a trench formed therein,
    wherein the carbon source layer is formed in the trench, and
    wherein the metal catalyst layer is deposited on the carbon source layer formed in the trench such that the trench is filled with the metal catalyst.

3. The method of claim 1, further comprising: between steps b) and c),
    b') depositing a carbon source on an exposed surface of the metal catalyst layer.

4. The method of claim 3, further comprising:
    before step b'), removing the portion of the graphene layer and the metal catalyst layer formed on the top surface of the substrate where no metal interconnect is to be formed; and
    after step c), removing a portion of the carbon source layer that was not involved in synthesizing the graphene.

5. The method of claim 1, comprising: repeating steps a) and b) alternately,
    wherein another substrate is stacked on the substrate after step b).

6. The method of claim 5, comprising: after step b),
    repeating steps of removing a portion of the graphene layer and the metal catalyst layer formed on the top surface of the substrate where no metal interconnect is to be formed, and stacking another substrate on the substrate.

7. The method of claim 5, further comprising: between steps b) and c),
b') depositing a carbon source on an exposed surface of the metal catalyst layer.

8. The method of claim 1, wherein the carbon source comprises at least one selected from the group consisting of: natural graphite, synthetic graphite, highly ordered pyrolytic graphite (HOPG), activated graphite, carbon monoxide, carbon dioxide, methane, ethane, ethylene, methanol, ethanol, acetylene, propane, propylene, butane, butadiene, pentane, pentene, cyclopentadiene, hexane, cyclohexane, benzene, pyridine, toluene, polymethyl methacrylate (PMMA), polystyrene, polyacrylonitrile (PAN), PEDOT:PSS, molecules having a polyaromatic hydrocarbon (PAH) structure, methylnaphthalene, hexabromobenzene, naphthalene, terphenyl, pentachloropyridine, tetrabromothiophene, benzopyrene, azulene, trimethylnaphthalene, acenaphthene, acenaphthylene, anthracene, fluorene, phenalene, phenanthrene, benz(a)anthracene, benzo(a)fluorene, benzo(c)phenanthrene, chrysene, fluoranthene, pyrene, tetracene, triphenylene, benz(e)acephenanthrylene, benzofluoranthene, dibenzanthracene, olympicene, pentacene, perylene, picene, tetraphenylene, zethrene, ovalene, kekulene, hexacene, heptacene, diindenoperylene, dicoronylene, coronene, corannulene, benzo(ghi)perylene, anthanthrene, hexamethyl-dihydro-4H-benzoquinolizinoacridine, 4H-benzoquinolizinoacridinetrione, and hexaazatriphenylene-hexacarbonitrile.

9. The method of claim 1, wherein the metal catalyst layer comprises at least one selected from the group consisting of: copper (Cu), nickel (Ni), iron (Fe), platinum (Pt), aluminum (Al), cobalt (Co), ruthenium (Ru), palladium (Pd), chromium (Cr), manganese (Mn), gold (Au), silver (Ag), molybdenum (Mo), rhodium (Rh), tantalum (Ta), titanium (Ti), tungsten (W), uranium (U), vanadium (V), zirconium (Zr), iridium (Ir), brass, bronze and stainless steel.

10. The method of claim 1, wherein the heat treatment is carried out at a temperature from 25 to 400°C.

11. The method of claim 1, wherein a heat source for carrying out the heat treatment is at least one selected from a group consisting of a microwave source, an ultraviolet light source, a plasma source, a laser source and a heater.

12. The method of claim 1, wherein the removing the portion of the layers formed on the top surface of the substrate is carried out by at least one selected from the group consisting of: polishing, evaporation, wet etching and dry etching.

13. A semiconductor device comprising:
a plurality of substrates, wherein each substrate of the plurality of substrates has a trench therein;
a plurality of metal catalyst layers, wherein each metal catalyst layer fills the trench of one substrate of the plurality of substrates; and
a graphene disposed in contact with all or all but one surfaces of the plurality of metal catalyst layers,
wherein the surface of the plurality of metal catalyst layers that is not in contact with the graphene is exposed out of the trench of one substrate of the plurality of substrates,
wherein the plurality of substrates are staking on each other, and
wherein metal-graphene heterojunction metal interconnect is formed in each substrate of the plurality of substrates.

* * * * *